(12) United States Patent
Tsai et al.

(10) Patent No.: US 7,364,126 B2
(45) Date of Patent: Apr. 29, 2008

(54) EJECTABLE STAND

(75) Inventors: Sheng-Yu Tsai, Taipei (TW); Sheng-An Tang, Taipei (TW)

(73) Assignee: Tatung Company, Taipei (TW)

( * ) Notice: Subject to any disclaimer, the term of this patent is extended or adjusted under 35 U.S.C. 154(b) by 170 days.

(21) Appl. No.: 11/298,536

(22) Filed: Dec. 12, 2005

(65) Prior Publication Data
US 2007/0080269 A1  Apr. 12, 2007

(30) Foreign Application Priority Data
Oct. 12, 2005  (TW)  .............................. 94217619 U

(51) Int. Cl.
*A47B 91/00* (2006.01)
*H05K 7/00* (2006.01)

(52) U.S. Cl. ................... 248/188.8; 248/677; 361/681; 361/683

(58) Field of Classification Search ............. 248/188.8, 248/590, 592, 594, 599, 615, 677, 455, 171; 361/681, 683
See application file for complete search history.

(56) References Cited

U.S. PATENT DOCUMENTS

| | | | | |
|---|---|---|---|---|
| 4,113,212 A | * | 9/1978 | Coriden | 248/455 |
| 4,940,204 A | * | 7/1990 | Nelson et al. | 248/688 |
| 5,620,163 A | * | 4/1997 | Wu | 248/688 |
| 5,996,956 A | * | 12/1999 | Shawver | 248/309.1 |
| 6,880,796 B2 | * | 4/2005 | Khor et al. | 248/677 |
| 2007/0012856 A1 | * | 1/2007 | Chan et al. | 248/677 |

* cited by examiner

*Primary Examiner*—Anita M. King
(74) *Attorney, Agent, or Firm*—Bacon & Thomas, PLLC

(57) ABSTRACT

An ejectable stand for a portable media center includes a stand body and a slide switch. The stand body has a front end, a rear end and an outer surface, and the rear end has a torsion spring pushing against both the stand body and the portable media center, and the front end has a stop. The slide switch slidably is mounted on the outer surface of the stand body and has a fastening hook corresponding to the fastening lip of the portable media center, and the fastening hook includes a compression spring pushing against both the fastening hook and stop of the stand body. The compression spring provides an elastic force to drive the fastening hook to slide the slide switch on the stand body and to fasten the fastening hook and the fastening lip together.

6 Claims, 6 Drawing Sheets

EJECTABLE STAND

BACKGROUND OF THE INVENTION

1. Field of the Invention

The present invention relates to an ejectable stand, and more particularly, to an ejectable stand that can be combined with a portable media center.

2. Description of the Related Art

With technological improvements, multimedia capabilities are being integrated into portable electronic devices, providing so-called portable media centers (PMCs). A portable media center can store, play, or record different multimedia formats, such as MP3, VCD, DVD, etc. As a result, portable media centers are very popular products.

Please refer to FIG. 1 and FIG. 2. FIG. 1 is a front perspective view of a prior art portable media center. FIG. 2 is a back perspective view of a prior art portable media center. As shown in FIG. 1, a portable media center 9 has a screen 93 and several control buttons 94. As shown in FIG. 2, the portable media center 9 further comprises a support structure 95 for supporting the portable media center 9 at a predetermined angle.

Typically, the support structure 95 has a separate cover switch 91 and a stand 92, which require the assembly of many parts. When the stand 92 is used, the portable media center 9 must be turned over, and both hands are required to activate the cover switch 91 and open the stand 92, which can be inconvenient for the user.

Therefore, it is desirable to provide an ejectable stand capable of being combined with a portable media center to mitigate and/or obviate the aforementioned problems.

SUMMARY OF THE INVENTION

In this present invention, an ejectable stand for a portable media center, the portable media center comprising a back with an extended depression, the extended depression having a first end and a second end, the first end having a fastening lip the ejectable stand includes a stand body and a slide switch.

The stand body is disposed in the extended depression of the portable media center. The stand body has a front end, a rear end and an outer surface, the rear end pivotally connected to the second end of the extended depression, and the rear end has a torsion spring pushing against both the stand body and the extended depression, and the front end has a stop.

The slide switch slidably is mounted on the outer surface of the stand body and has a fastening hook corresponding to the fastening lip of the portable media center, and the fastening hook includes a compression spring pushing against both the fastening hook and stop of the stand body. The compression spring provides an elastic force to drive the fastening hook to slide the slide switch on the stand body and to fasten the fastening hook and the fastening lip together.

The stand body and the slide switch are integrated together to reduce the number of the parts. Moreover, the slide switch has large activation area, and so is easy to operate. The user can open the ejectable stand with the touch of a single finger.

Moreover, the slide switch further comprises an outer face, the outer face having a plurality of anti-slip ridges to increase friction so that the ejectable stand can be opened easily Furthermore, the fastening hook further comprises a column extending towards the stop, the compression spring disposed around the column and pushing against the fastening hook and the stop This arrangement prevents the compression spring from falling, and the column also maintains the direction of the elastic force imparted by the compression spring, ensuring the compression spring pushes against, and between, the fastening hook and the stop.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
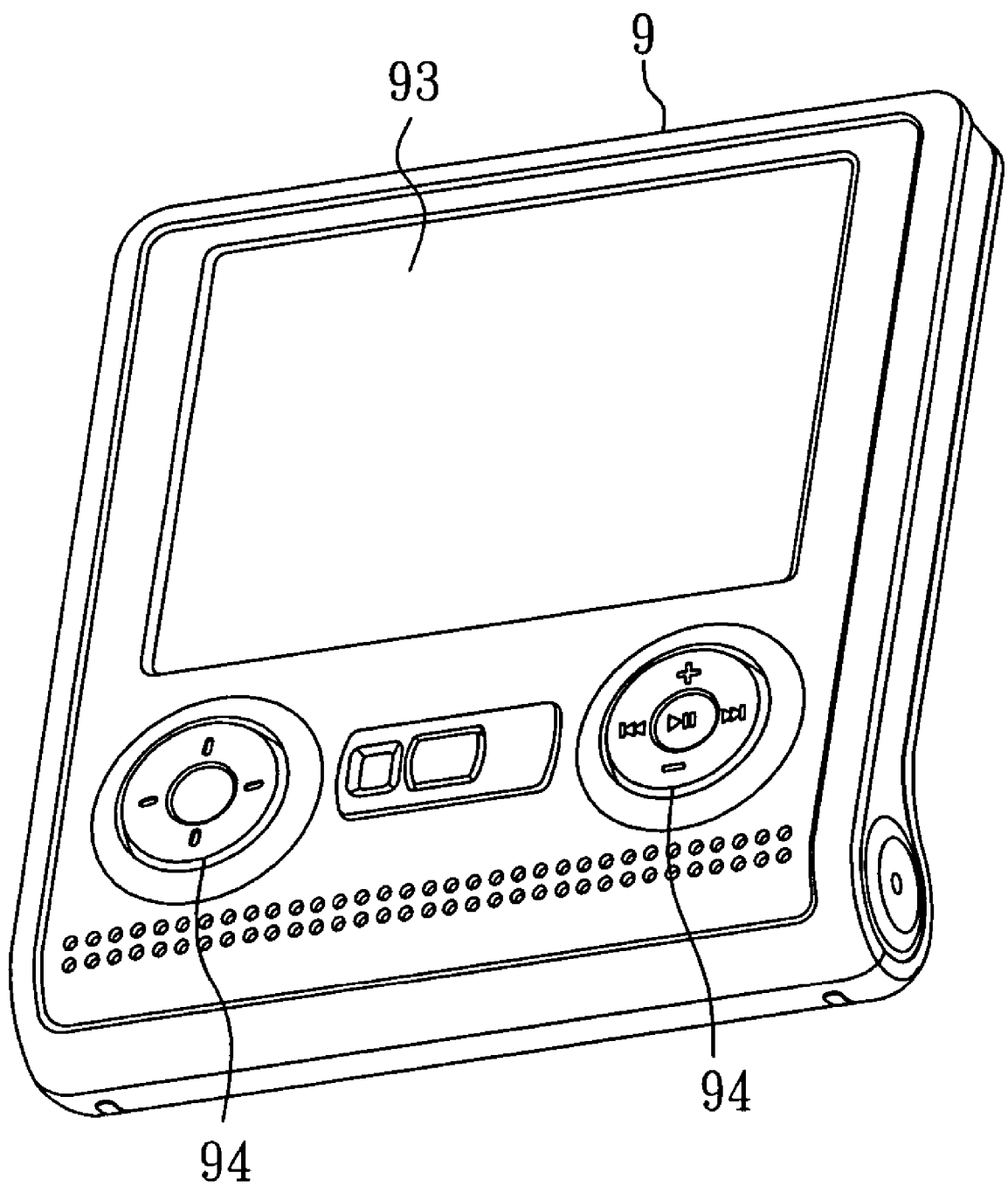
FIG. 1 is a front perspective view of a prior art portable media center.
Figure 2:
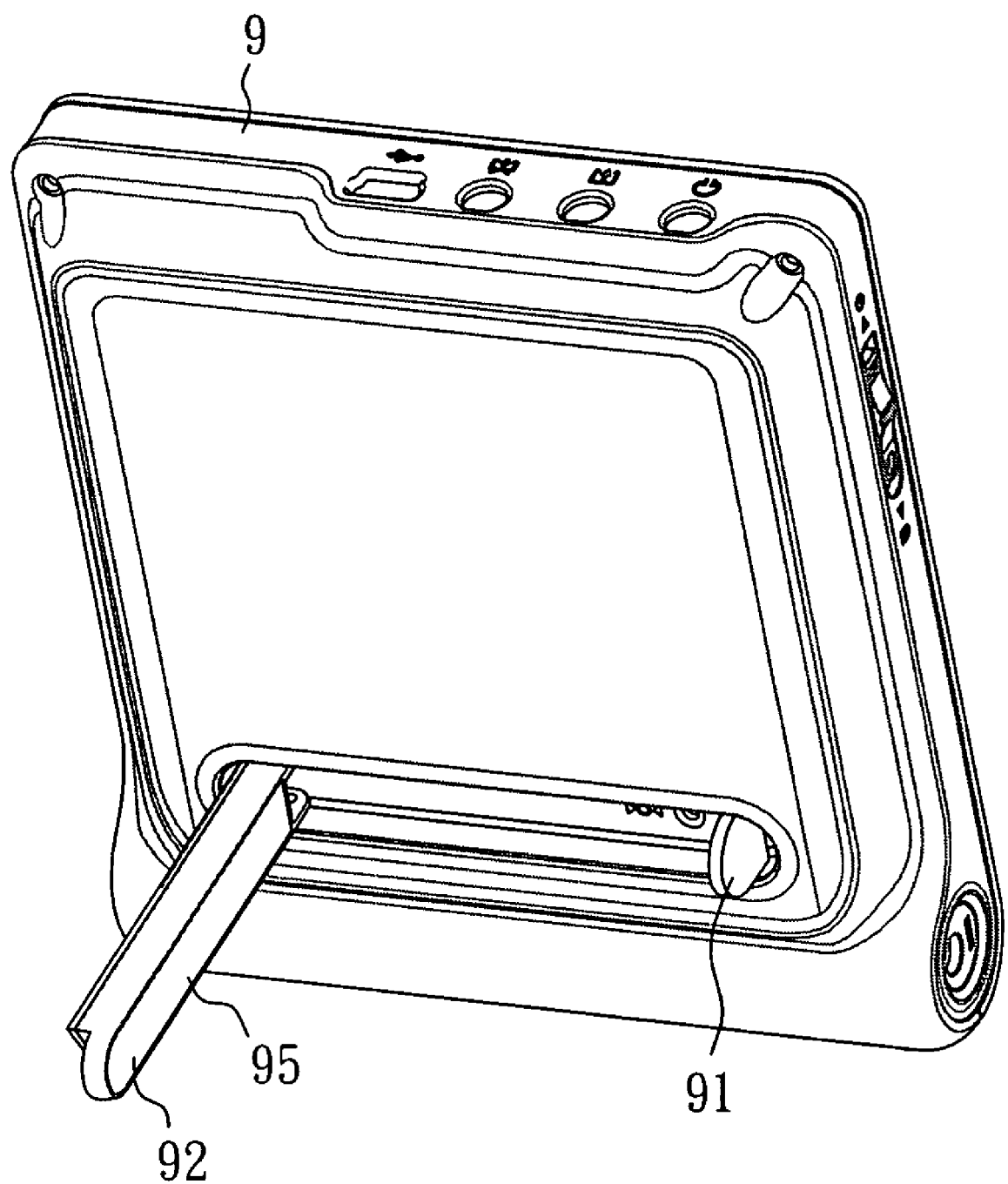
FIG. 2 is a back perspective view of a prior art portable media center.
Figure 3:
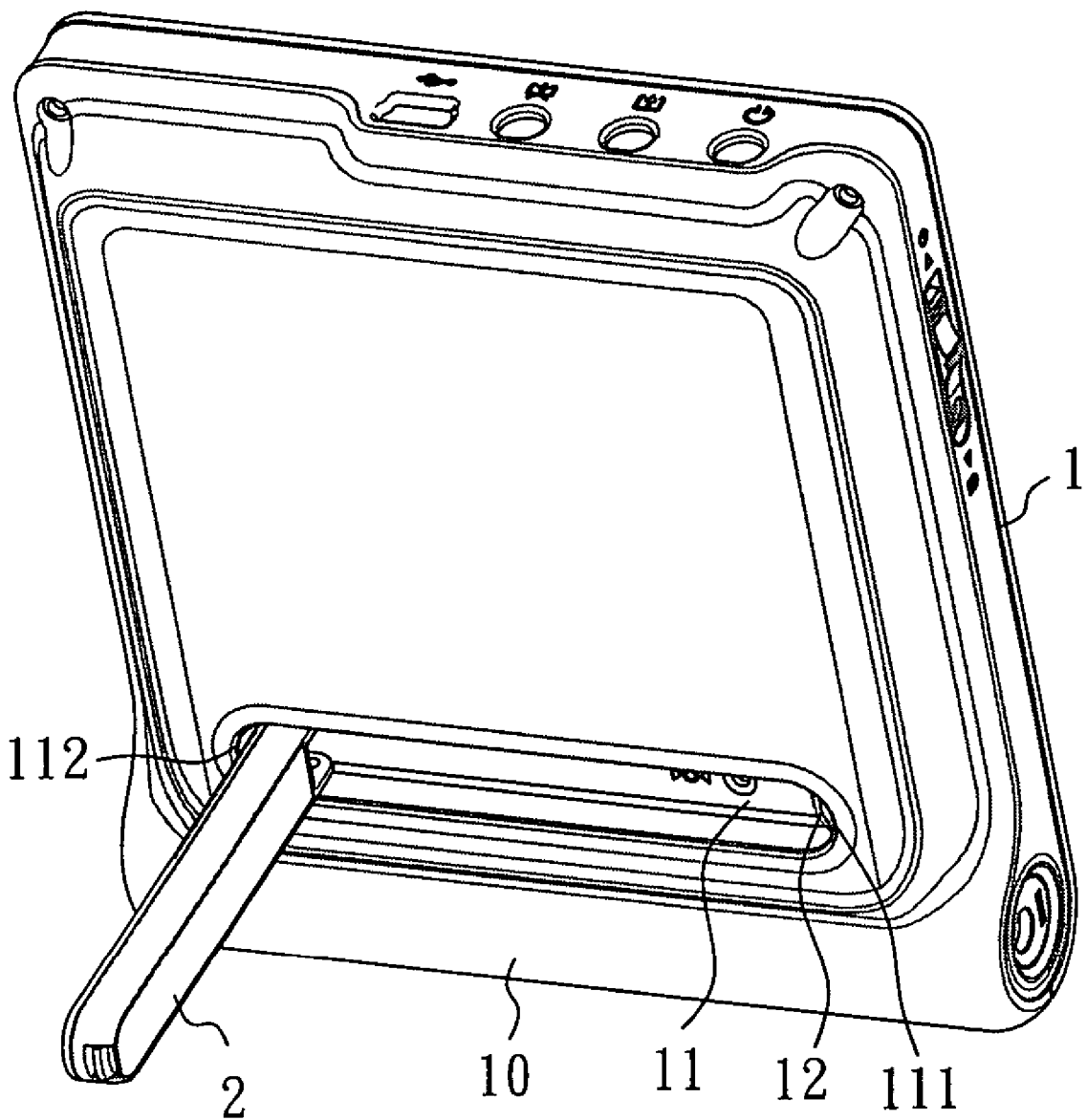
FIG. 3 is a back perspective view of a portable media center according to the present invention.
Figure 4:
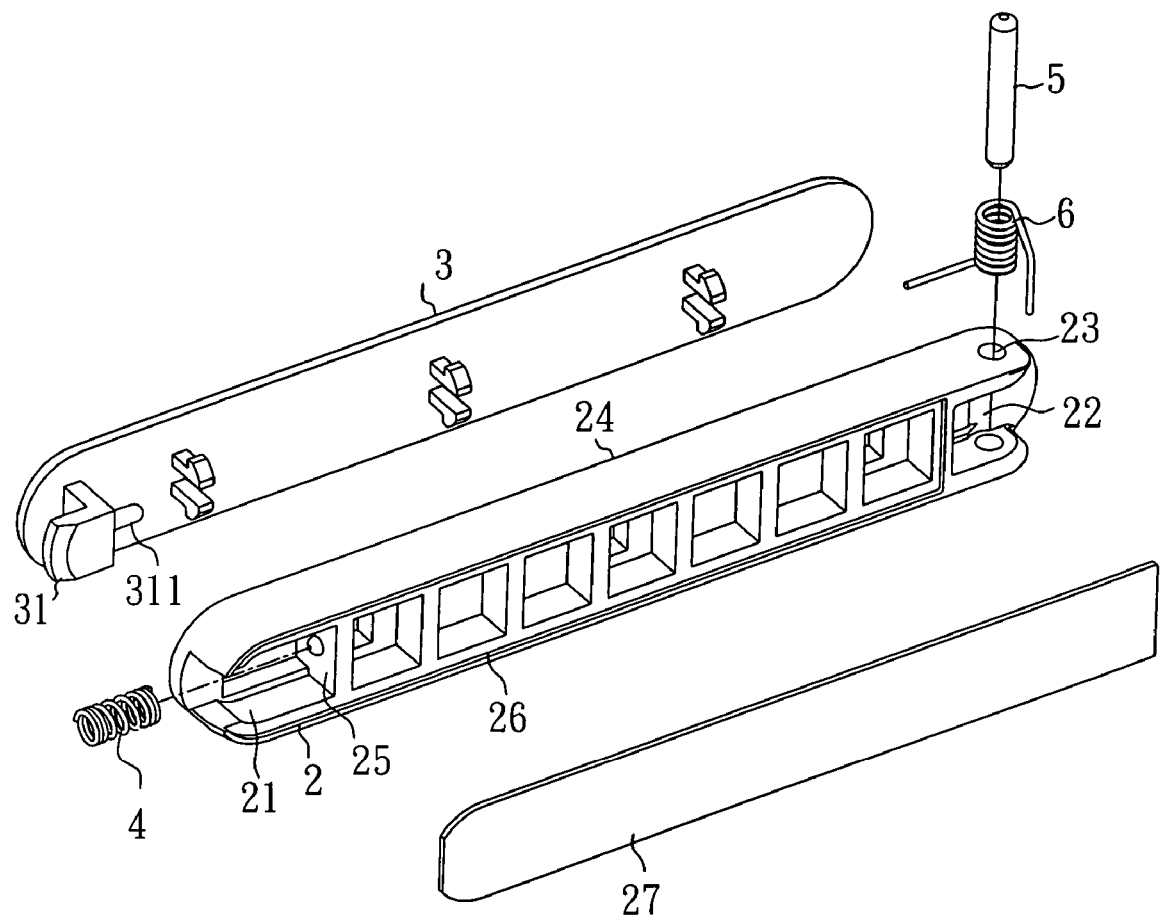
FIG. 4 is an exploded view of an ejectable stand according to the present invention.

Please refer to FIG. 3 and FIG. 4. FIG. 3 is a back perspective view of a portable media center according to the present invention. FIG. 4 is an exploded view of an ejectable stand according to the present invention.

In this embodiment, an ejectable stand may be utilized in a portable media center 1. The portable media center 1 comprises a back 10 with an extended depression 11. The extended depression 11 has a first end 111 and a second end 112, and the first end 111 has a fastening lip 12.

The ejectable stand comprises a stand body 2, and a slide switch 3.

In this embodiment, the stand body 2 is mounted in the extended depression 11 of the portable media center 1. The stand body 2 comprises a front end 21, a rear end 22, an outer face 24, an inner face 26 and a bottom strip 27. The rear end 22 is pivotally connected to the second end 112 of the extended depression 11, and the rear end 22 has a torsion spring 6, an axle 5 and an axle opening 23. The front end 21 has a stop 25.

The torsion spring 6 encloses the axle 5 and pushes against both the stand body 2 and the extended depression 11. The axle 5 is disposed in the axle opening 23 and pivotally connected to the second end 112 of the extended depression 11. The bottom strip 27 covers inner face 26.

Figure 5:
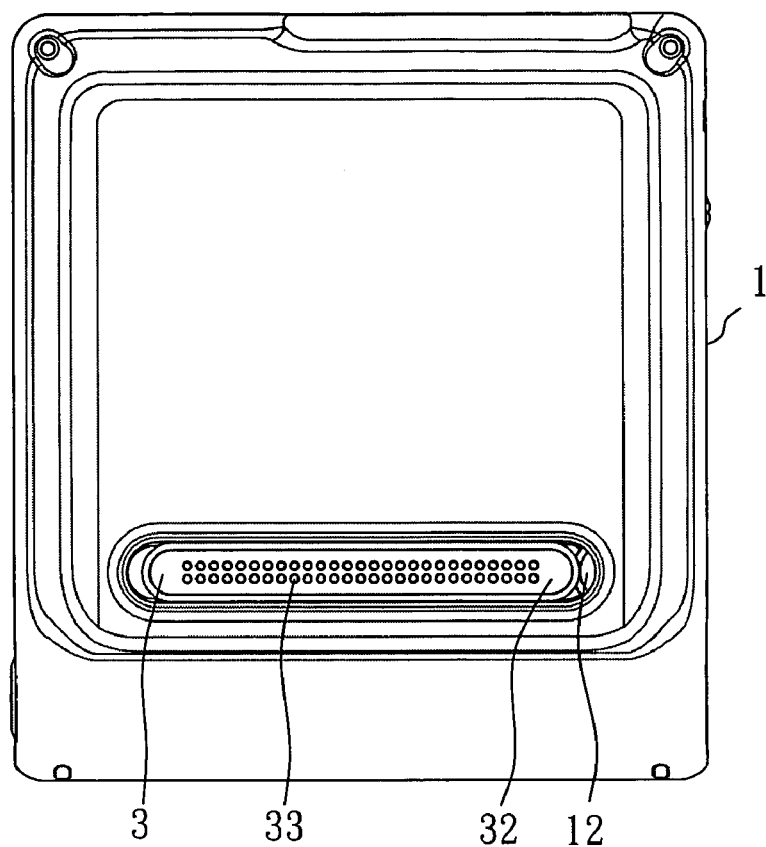
FIG. 5 shows the ejectable stand in a closed position according to the present invention.
Figure 6:
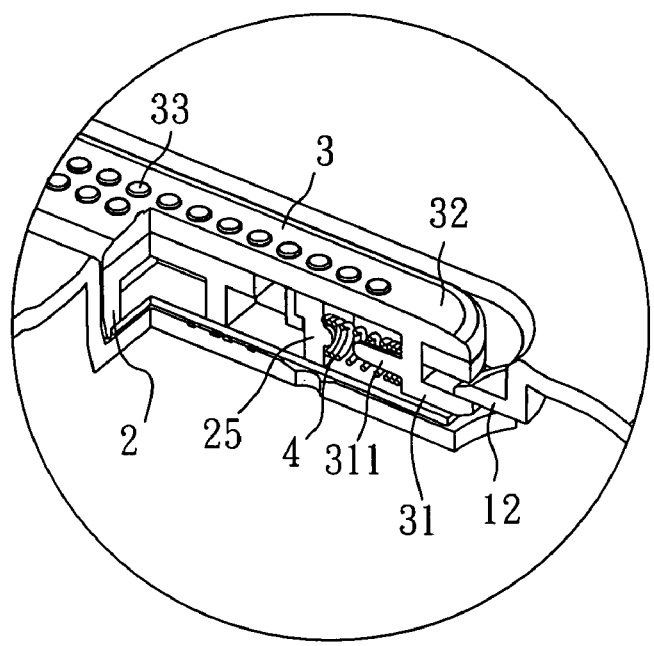
FIG. 6 is a cross-sectional view of a region depicted in FIG. 5.

Please refer to FIG. 4, FIG. 5 and FIG. 6. FIG. 4 is an exploded view of an ejectable stand according to the present invention. FIG. 5 shows the ejectable stand in a closed configuration according to the present invention. FIG. 6 is a cross-sectional view of a region depicted in FIG. 5. The slide switch 3 is slidably mounted on outer face 24 of the stand body 2. The slide switch 3 comprises an outer face 32 and a fastening hook 31. The outer face 32 has a plurality of anti-slip ridges 33 to increase friction so that the ejectable stand can be opened easily.

In FIG. 5 and FIG. 6, the fastening hook 31 corresponds to the fastening lip 12 of the portable media center 1. The fastening hook 31 further comprises a compression spring 4 and a column 311. The compression spring 4 pushes against both the fastening hook 31 and the stop 25 of the stand body 2. The compression spring 4 provides an elastic force that drives the fastening hook 31 to slide the slide switch 3 on the stand body 2, fastening the fastening hook and the fastening lip 12 together.

The column 311 extends towards to the stop 25. The compression spring 4 encloses the column 311 and pushes against the fastening hook 31 and the stop 25. This arrangement prevents the compression spring 4 from falling, and the column 311 also maintains the direction of the elastic force imparted by the compression spring 4, ensuring the compression spring 4 pushes against, and between, the fastening hook 31 and the stop 25.

Figure 7:
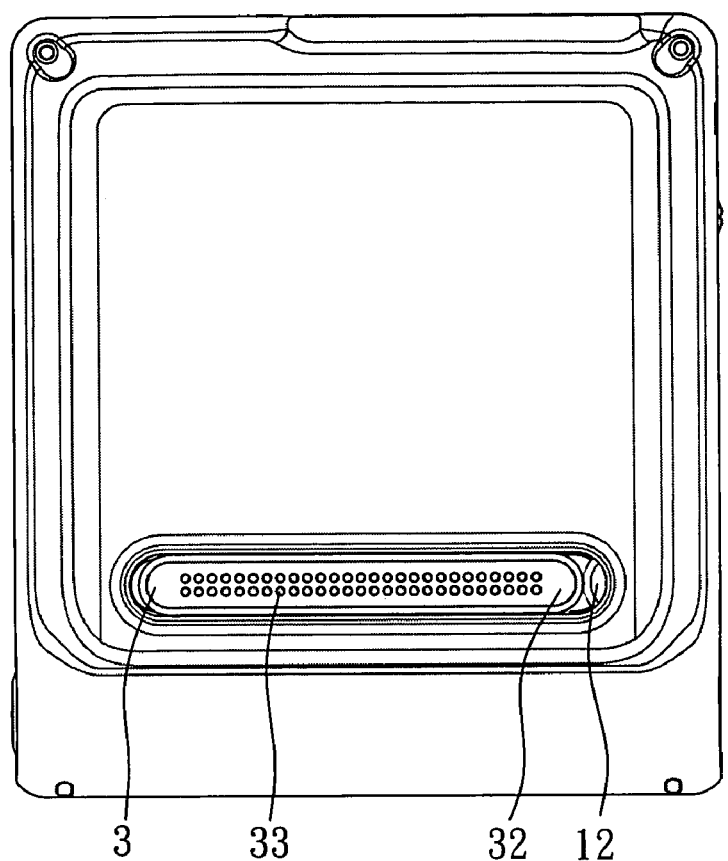
FIG. 7 shows the ejectable stand capable of being in an open state according to the present invention.
Figure 8:
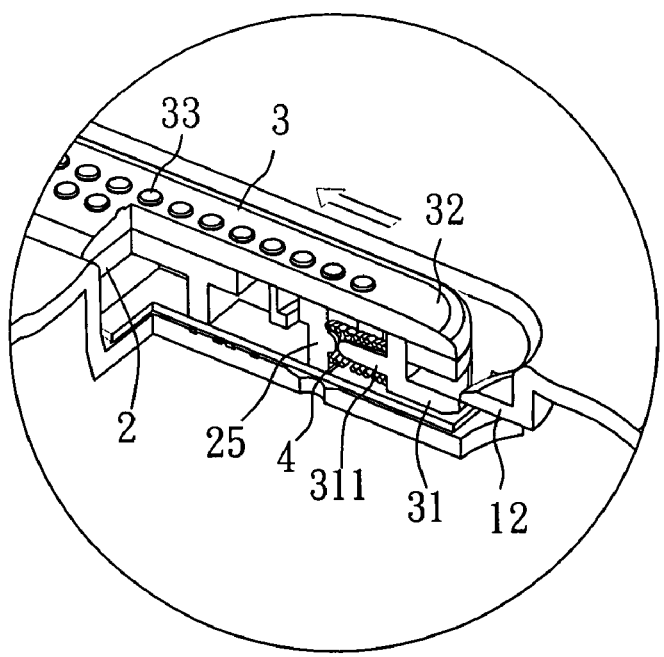
FIG. 8 is a cross-sectional view of a region depicted in FIG. 7.

Please refer to FIG. 7 and FIG. 8. FIG. 7 shows the ejectable stand capable of being in an OPEN state according to the present invention. FIG. 8 is a cross-sectional view of a region depicted in FIG. 7.

As shown in FIG. 5 and FIG. 6, the fastening hook 31 of the slide switch 3 is pushed by the compression spring 4, and fastened with the fastening lip 12, so the stand body 2 is contained within the extended depression 11 of the portable media center 1.

As shown in FIG. 7 and FIG. 8, when the slide switch 3 is moved backward by a user, the compression spring 4 of the fastening hook 31 of the slide switch 3 is pressed, and leaves the fastening lip 12 of the portable media center 1; meanwhile, the torsion spring 6 provides an elastic force to eject and extend the stand body 2 from the extended depression 11 at a predetermined angle, thus providing support for the portable media center 1 at an angle that provides a comfortable viewing angle for the user.

When the user pushes the stand body 2 back into the extended depression 11 of the portable media center 1, the fastening hook 31 of the slide switch 3 utilizes the elastic force provided by the compression spring 4 to fasten with the fastening lip 12, and so the stand body 2 remains disposed within extended depression 11 of the portable media center 1.

The stand body 2 and the slide switch 3 are integrated together to reduce the number of the parts. Moreover, the slide switch 3 has large activation area, and so is easy to operate. The user can open the ejectable stand with the touch of a single finger.

Although the present invention has been explained in relation to its preferred embodiment, it is to be understood that many other possible modifications and variations can be made without departing from the spirit and scope of the invention as hereinafter claimed.

What is claimed is:

1. An ejectable stand in combination with a portable media center, the portable media center comprising a back with an extended depression, the extended depression having a first end and a second end, the first end having a fastening lip, and the ejectable stand comprising:
    a stand body disposed in the extended depression of the portable media center, the stand body comprising a front end, a rear end and an outer surface, the rear end pivotally connected to the second end of the extended depression, and the rear end having a torsion spring pushing against both the stand body and the extended depression, the front end having a stop; and
    a slide switch slidably mounted on the outer surface of the stand body and having a fastening hook corresponding to the fastening lip of the portable media center, the fastening hook comprising a compression spring pushing against both the fastening hook and stop of the stand body, the compression spring providing an elastic force to drive the fastening hook to slide the slide switch on the stand body and to fasten the fastening hook and the fastening lip together.

2. The ejectable stand in combination with the portable media center as claimed in claim 1, wherein the rear end of the stand body further comprises an axle opening and an axle disposed in the axle opening and pivoted to the second end of the extended depression.

3. The ejectable stand in combination with the portable media center as claimed in claim 2, wherein the torsion spring is disposed around the axle and pushes against the stand body and the extended depression.

4. The ejectable stand in combination with the portable media center as claimed in claim 1, wherein the slide switch further comprises an outer face, the outer face having a plurality of anti-slip ridges.

5. The ejectable stand in combination with the portable media center as claimed in claim 1, wherein the stand body further comprises an inner face and a bottom strip, the bottom strip mounted above the inner face.

6. The ejectable stand in combination with the portable media center as claimed in claim 1, wherein the fastening hook further comprises a column extending towards the stop, the compression spring disposed around the column and pushing against the fastening hook and the stop.

* * * * *